(12) United States Patent
Vesanen et al.

(10) Patent No.: US 10,539,642 B2
(45) Date of Patent: Jan. 21, 2020

(54) METHOD FOR CALIBRATING A MAGNETIC RESONANCE IMAGING (MRI) PHANTOM

(71) Applicant: KONINKLIJKE PHILIPS N.V., Eindhoven (NL)

(72) Inventors: Panu Tapani Vesanen, Eindhoven (NL); Jukka Ilmari Tanttu, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 127 days.

(21) Appl. No.: 15/759,254

(22) PCT Filed: Sep. 6, 2016

(86) PCT No.: PCT/EP2016/070916
§ 371 (c)(1),
(2) Date: Mar. 12, 2018

(87) PCT Pub. No.: WO2017/045964
PCT Pub. Date: Mar. 23, 2017

(65) Prior Publication Data
US 2018/0252790 A1 Sep. 6, 2018

(30) Foreign Application Priority Data

Sep. 15, 2015 (EP) .................................... 15185230

(51) Int. Cl.
*G01R 33/58* (2006.01)
*G01R 33/54* (2006.01)

(52) U.S. Cl.
CPC ........... *G01R 33/58* (2013.01); *G01R 33/543* (2013.01)

(58) Field of Classification Search
CPC ..... G01R 33/58; G01R 33/583; G01R 33/543
(Continued)

(56) References Cited

U.S. PATENT DOCUMENTS 4,644,276 A 2/1987 Sierocuk et al.
4,749,948 A 6/1988 Duby et al.
(Continued)

FOREIGN PATENT DOCUMENTS

| DE | 102005050839 B3 | 4/2007 |
| WO | 2004106962 A1 | 12/2004 |
| WO | 2014097056 A1 | 6/2014 |

OTHER PUBLICATIONS

Stanescu et al "Investigation of a 3D System Distortion Correction Method for MR Images" Journal of Applied Clinical Medical Physics vol. 11(1) 2010.
(Continued)

*Primary Examiner* — Patrick Assouad
*Assistant Examiner* — Demetrius R Pretlow
(74) *Attorney, Agent, or Firm* — Sherry Austin

(57) ABSTRACT

It is an object of the invention to improve MRI based treatment, especially MRI based radiotherapy. This object is achieved by a method for calibrating a magnetic resonance imaging (MRI) phantom having an expected geometry and comprising at least one MRI detectable part with a position within the geometry which is known with a geometric inaccuracy. The method comprises the following steps: step 1: placing the phantom at a predetermined location in a magnetic resonance system such that the MRI detectable part is within a symmetry plane of a gradient system of the magnetic resonance imaging system and; step 2: acquiring an MRI image of the MRI detectable part of the phantom by means of a first sequence, wherein the MRI image comprises multiple slices; step 3: determining the geometric inaccuracy of the MRI detectable part of the MRI phantom based on the position and the representation of the part in the MRI image.

12 Claims, 3 Drawing Sheets

(58) Field of Classification Search
USPC .......................................................... 324/309
See application file for complete search history.

(56) References Cited

U.S. PATENT DOCUMENTS

| | | | |
|---|---|---|---|
| 5,055,791 A | 10/1991 | Leroux et al. | |
| 6,522,139 B1* | 2/2003 | Thompson | G01R 33/5615 324/306 |
| 6,594,516 B1* | 7/2003 | Steckner | G06K 9/3216 600/411 |
| 8,927,921 B1* | 1/2015 | Nelms | A61N 5/1031 250/252.1 |
| 2004/0228451 A1* | 11/2004 | Wu | A61B 6/583 378/207 |
| 2008/0077006 A1* | 3/2008 | Katscher | G01R 33/50 600/414 |
| 2009/0052755 A1* | 2/2009 | Herold | A61B 6/032 382/131 |
| 2009/0123042 A1* | 5/2009 | Gagnon | G06T 3/4061 382/128 |
| 2010/0021029 A1 | 1/2010 | Pearlstein et al. | |
| 2010/0278409 A1* | 11/2010 | Wiemker | A61B 6/583 382/131 |
| 2011/0142316 A1* | 6/2011 | Wang | G06T 11/006 382/131 |
| 2011/0200244 A1 | 8/2011 | Ashton et al. | |
| 2012/0004530 A1* | 1/2012 | Liu | G01R 33/50 600/410 |
| 2012/0201438 A1 | 8/2012 | Vermandel et al. | |
| 2013/0200900 A1* | 8/2013 | Buurman | G01R 33/50 324/322 |
| 2014/0016759 A1* | 1/2014 | Ngar | A61N 5/1075 378/207 |
| 2015/0088449 A1 | 3/2015 | Foxall et al. | |
| 2016/0133159 A1* | 5/2016 | Saloux | G09B 23/32 73/866.4 |
| 2016/0192896 A1* | 7/2016 | Perkins | G01T 1/2985 250/252.1 |
| 2016/0279445 A1* | 9/2016 | Ju | A61N 5/1075 |
| 2017/0050052 A1* | 2/2017 | Burgett | A61N 5/1071 |
| 2018/0033166 A1* | 2/2018 | Cachovan | G06T 11/005 |

OTHER PUBLICATIONS

Mattila S et al: "Phantom-based evaluation of geometric distortions in functional magnetic resonance and diffusion tensor imaging", Magnetic Resonance in Medicine, John Wiley & Sons, Inc, US, vol. 57, No. 4, Apr. 1, 2007 (Apr. 1, 2007), pp. 754-763.

Wills R et al: "Applicator reconstruction for HDR cervix treatment planning using images from 0.35T open MR scanner", Radiotherapy and Oncology, Elsevier, Ireland, vol. 94, No. 3, Mar. 1, 2010 (Mar. 1, 2010), pp. 346-352.

Littmann A etal: "Acquisition-Related Morphological Variability in Structural MRI", Academic Radiology, Reston, VA, US, vol. 13, No. 9, Sep. 1, 2006 (Sep. 1, 2006), pp. 1055-1061.

Schad L et al: "Correction of Spatial Distortion in MR Imaging: A Prerequisite for Accurate Stereotaxy", Journal of Computer Assisted Tomography, New York, NY, US, vol. 11, No. 3, Jan. 1, 1987 (Jan. 1, 1987), pp. 499-505.

Hanvey S, Foster J: "A three-dimensional magnetic resonance imaging geometric distortion correction algorithm for radiotherapy", Proceedings of the International Society for Magnetic Resonance in Medicine, ISMRM, 18th Scientific Meeting and Exhibition, Stockholm, Sweden, May 1-7, 2010, Apr. 17, 2010 (Apr. 17, 2010), p. 5043.

Winfield Jessica M et al: "A framework for optimization of diffusion-weighted MRI protocols for large field-of-view abdominal-pelvic imaging in multicenter studies", Medical Physics, AIP, Melville, NY, US, vol. 43, No. 1, Jan. 1, 1901 (Jan. 1, 1901), pp. 95-110.

QA Phantom Specification Sheet.

Marcel Breeuwer et al, "Detection and Correction of Geometric Distortion in 3D MR Images" Medical Imaging 2001: Image Processing, 1110 Proceedings of SPIE vol. 4322 (2001).

Romain Viard et al "Characterization and 3d Correction of Geometric Distortion in Low Field Open Magnet MIR" 30 th Annual International Conference, Aug. 20-24, 2008.

Jeffrey L. Gunter et al, "Measurement of MRI Scanner Performance with ADNI Phantom" Med. Phys. 36 (6) Jun. 2009, p. 2193-2205.

Phantom Lab Brochure.

* cited by examiner

US 10,539,642 B2

METHOD FOR CALIBRATING A MAGNETIC RESONANCE IMAGING (MRI) PHANTOM

CROSS REFERENCE TO RELATED APPLICATIONS

This application is a U.S. national phase application of International Application No. PCT/EP2016/070916, filed on Sep. 6, 2016, which claims the benefit of EP Application Serial No. 15185230.8 filed on Sep. 15, 2015 and is incorporated herein by reference.

FIELD OF THE INVENTION

The invention relates to magnetic resonance imaging and more specifically to determining geometric accuracy of magnetic resonance imaging.

BACKGROUND OF THE INVENTION

For certain applications, especially in the area of therapy, geometric accuracy of magnetic resonance images is important. To measure the geometric accuracy of a magnetic resonance imaging (MRI) scanner, phantoms with MRI visible material in well-defined locations are typically used. For a limited field-of-view (FOV), such as a spherical volume of 200-300 mm in a diameter, such phantoms have existed for a while. However, in the context of radiotherapy, the geometric accuracy needs to be characterized in the whole volume covered by the patient and used in the radiotherapy planning; the skin contour can fill a spherical or cylindrical volume of up to 500 mm in diameter.

For example Stanescu et al Investigation of a 3D system distortion correction method for MR images, Journal of applied clinical medical physics, vol 11(1), 2010 describes a phantom for use in the field of radiation treatment planning. The phantom has a size of 260×260×280 mm3.

SUMMARY OF THE INVENTION

It is an object of the invention to improve MRI based treatment, especially MRI based radiotherapy. This object is achieved by a method for calibrating a magnetic resonance imaging (MRI) phantom having an expected geometry and comprising at least one MRI detectable part with a position within the geometry which is known with a geometric inaccuracy, wherein the method comprises steps of step 1: placing the phantom at a predetermined location in a magnetic resonance system such that the MRI detectable part is within a symmetry plane of a gradient system of the magnetic resonance imaging system and;

step 2: acquiring an MRI image of the MRI detectable part of the phantom by means of a first sequence, wherein the MRI image comprises multiple slices;

step 3: determining the geometric inaccuracy of the MRI detectable part of the MRI phantom based on the position and the representation of the part in the MRI image.

According to another aspect, the invention is a computer program product according to claim 8.

To measure the geometric accuracy in the whole imaging volume of a MRI scanner (such as a spherical volume of 500 mm in diameter), a large and mechanically accurate phantom with MR visible features in well-defined locations is needed. It is an insight of the inventors that it is challenging to manufacture a stable phantom of such size. Furthermore, it is an insight of the inventors that manufacturing of such a phantom with sub-millimeter precision is difficult. In order to relax the requirement of mechanical accuracy, the phantom can be calibrated with an independent measurement prior to the actual MRI distortion measurement in order to determine the deviation from the expected geometry of the phantom. By using the proposed calibration method, geometric accuracy can be more reliably determined over a larger FOV, which may in turn improve the accuracy of therapy based on the MRI images.

The calibration procedure is based on a few assumptions. It is assumed that within the MRI scanner, an $x=0$ plane has zero x-distortion, a $y=0$ plane has zero y-distortion and a $z=0$ plane has zero z-distortion. This may be assumed because of the symmetry planes of the gradient coils (which are located at $x=0$, $y=0$ or $z=0$). So if the part of the phantom which is being calibrated deviates from the symmetry plane in an MRI image of this part, it can be assumed that this deviation is caused by a mechanical inaccuracy and that this inaccuracy is not caused by the imaging sequence used. After the inaccuracies of the phantom have been determined, this information can be taken into account when determining the inaccuracy of a subsequent MRI scan, e.g. an MRI scan to be used to make a radiotherapy plan.

Multiple slices need to be acquired in a direction in order to determine deviations of the part of the phantom from the symmetry plane. Preferably the slices have a thickness of less than a millimeter. To this end, the first sequence could be a 3D sequence. Alternatively, multiple 2D slices could be acquired. Preferably those multiple 2D slices are not spaced apart. Preferably the sequence is a fast field echo or a turbo spin echo sequence.

MRI phantoms are made of MRI compatible materials and such materials are chosen such that they only minimally effect a B0 field of the MRI system. However, there will always be some B0 effects. Therefore, according to embodiments of the invention, a high signal bandwidth in a read-out direction is used in the first sequence during a reception phase of an image acquisition. The use of such high signal bandwidth will help to make the effect of B0 distortions on the calibration process negligible. According to other embodiments of the invention, the read-out direction is chosen such that it is within the symmetry plane. In this way the B0 effects on a resulting MRI image will be reduced.

According to one embodiment, the method for calibrating is applied to multiple parts of the MRI phantom. In this way a larger region can be calibrated. By applying the calibration method to multiple parts of the MRI phantom, a larger region of the phantom is suitable for determining the geometric accuracy of subsequent MRI images. The application to multiple parts can be achieved by placing the phantom along multiple symmetry planes simultaneously (e.g. one part within the $x=0$ plane and one part within the $y=0$ plane). Also, the phantom may be moved between determining the geometric inaccuracy of a first part and a second part. This could for example be done by replacing it manually or by moving a scanner table of the MRI system. This movement could also be controlled automatically by means of the computer program product. In this way a larger part of the phantom may be calibrated and in turn the geometric accuracy of the subsequent MRI image can be determined for a larger FOV. For radiotherapy applications a FOV of 300 mm and larger in a direction of a z-axis of the MRI system is advantageous. In these cases, preferably, a sequence used to determine the geometric accuracy of a first part of the phantom is the same as a sequence used to determine the geometric accuracy of a second part of the phantom.

According to another aspect, the invention is a magnetic resonance imaging (MRI) phantom comprising a plurality of plates or planar structures having a length of more than 300 mm and spaced apart from each other, wherein the plates comprise markers which are detectable by a magnetic resonance imaging system, whereby the markers of the plates have known relative positions with respect to other markers in the plate, and whereby the relative positions of the plates with respect to each other are less accurate known than the relative positions of the markers on the plates. The reason for this is that during manufacturing the marker positions within a plate can be made accurate, whereas the relative position of the plates with respect to each other cannot be that accurately manufactured.

By its size the phantom is large enough for calibrating MRI images to be used for (radio)therapy purposes in many applications and patients. The phantom is designed such that accuracy of the positions of the markers within the plate or planar structure is large enough to be used for the purpose of determination of the geometric accuracy of an MRI image. The relative position of the plates is less accurate making it easier and/or cheaper to create a large phantom. By using plates in the phantom it is possible to position parts (in this case the plates) of the phantom within the symmetry plane of the gradient system of the MRI system. This enables the above mentioned calibration procedure.

Preferably the length of one or more of the plates is larger than 400 mm in order to cover a larger FOV. According to embodiments of the invention the MRI phantom comprises a first plate and a last plate, wherein a distance between the first and the last plate is more than 300 mm. This is advantageous because such phantom could be used to calibrate over a FOV of 300 mm along the z-direction of the MRI system.

These and other aspects of the invention will be apparent from and elucidated with reference to the embodiments described hereinafter.

DETAILED DESCRIPTION OF THE INVENTION

Figure 1:
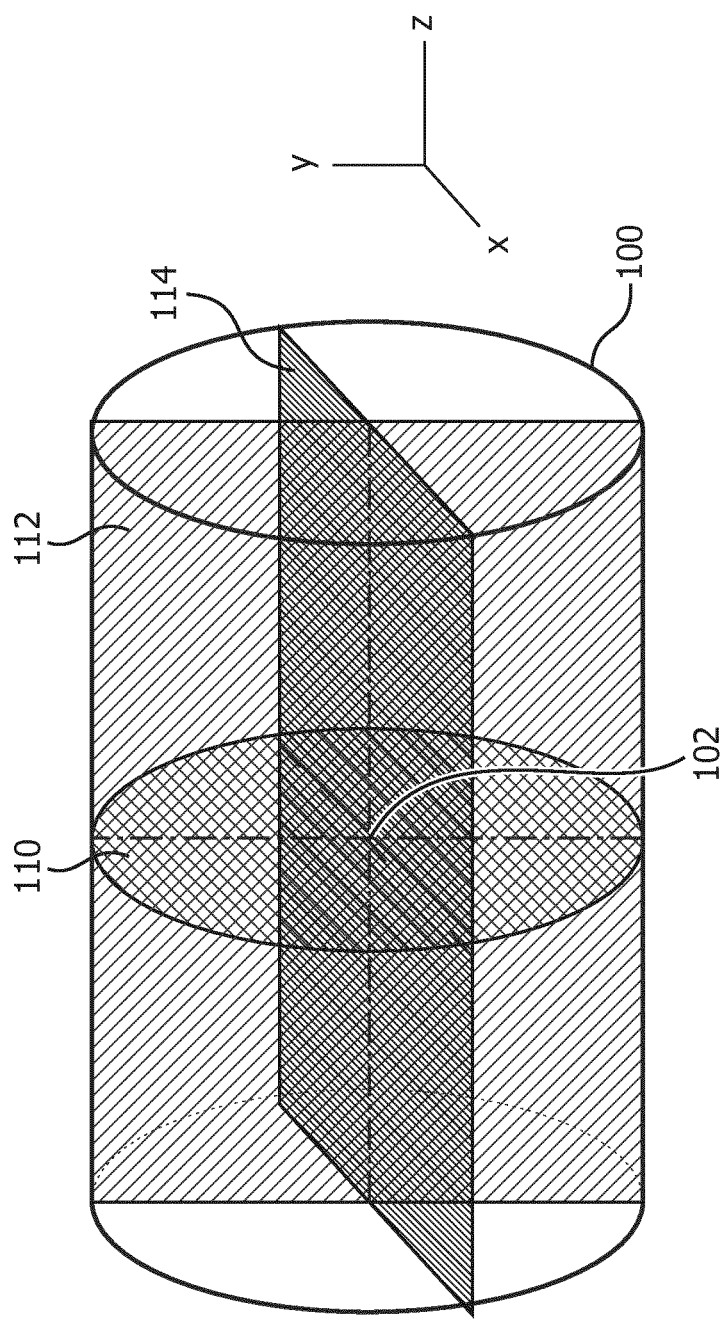
FIG. 1 diagrammatically shows an examination space 100 of a magnetic resonance imaging MRI system and FIG. 2 diagrammatically shows an example of a phantom.

FIG. 1 diagrammatically shows an examination space 100 of a magnetic resonance imaging MRI system. The MRI system comprises an x-, y-, and z-gradient coil system in order to apply magnetic field gradients in the x-, y- and z-direction respectively. There may be some distortions in a gradient field generated by the gradient coils. However, it may be assumed that an x=0 plane 112 has zero x-distortion, a y=0 plane 114 has zero y-distortion and a z=0 plane 110 has zero z-distortion. The reason for this is that those planes are symmetry planes of the gradient coil system of the MRI system. Further, in FIG. 1, the isocenter 102 is shown.

Figure 2:
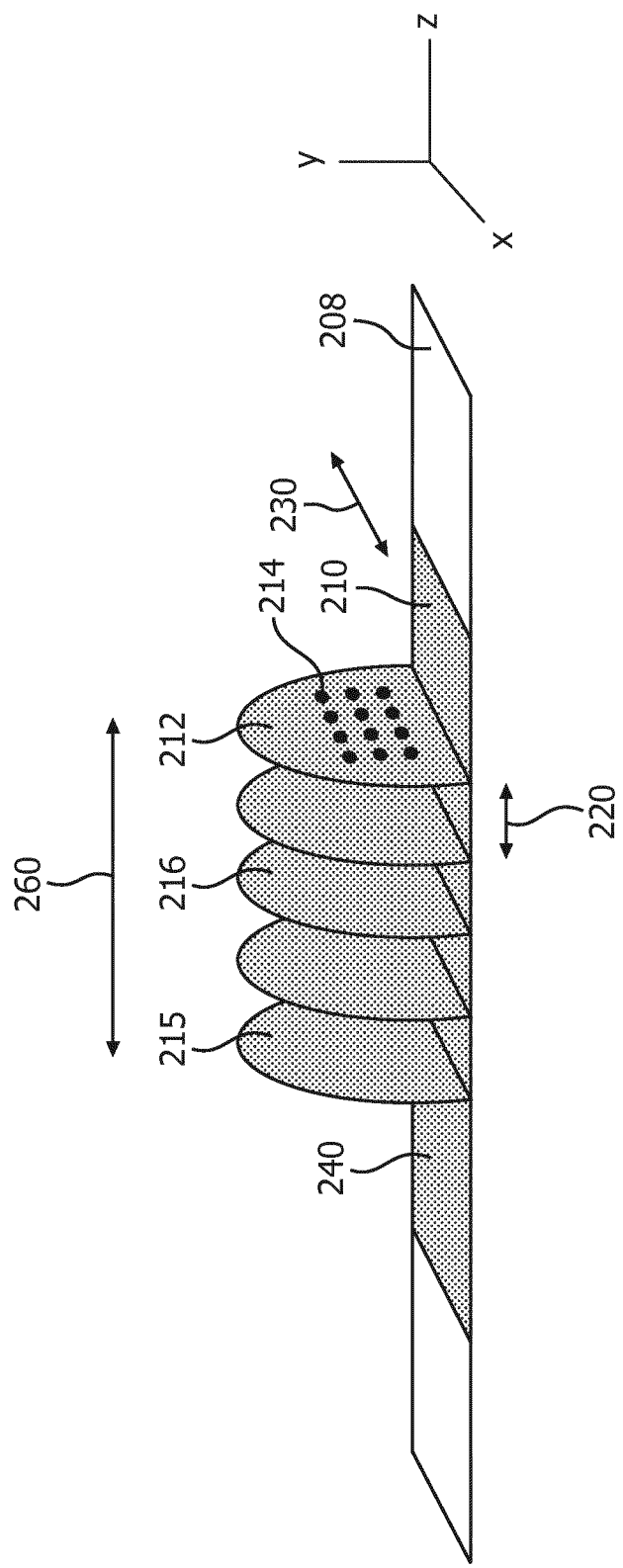

FIG. 2 diagrammatically shows an example of a phantom 210, which is configured to be placed in the examination space 100. The phantom 210 comprises multiple plates, which when positioned perpendicular to a scanner table 208 of the MRI system are parallel to the z=0 plane 110. The plates comprise MRI detectable markers 214. The plates could be placed directly on the scanner table spaced apart 220 from each other. However, preferably the plates are connected to each other by means of a connection member 240 such that they are connected but spaced apart. The connection member is preferably rigid. The connection member is not necessarily touching the scanner table when in use. The length 230 of one or more of the plates is 300 mm or larger, preferably 400 mm or larger. A distance 260 between a first 212 and a last 215 plate is preferably more than 200 mm and more preferably more than 300 mm.

The calibration procedure is based on a few assumptions. First, it is assumed that for the plates 212, 215, 216, a grid of marker inserts 214 (only shown on a single plate) can be made accurate. This assumption is limited to an in-plane spacing of the markers and can be verified by a mechanical measurement before assembling the phantom. Specifically, nothing is assumed about a through-plane accuracy of the inserts, e.g., the plates 212 are allowed to be curved. Another source of inaccuracy is that the plates may not be perfectly aligned with respect to each other, e.g., the whole marker grid of one plate may have an x and/or y offset with respect to the marker grid of another plate. For measuring these offsets and the curvature of the marker plates, the above mentioned assumptions are needed: The x=0 plane has zero x-distortion, the y=0 plane has zero y-distortion and the z=0 plane has zero z-distortion. Ideally, these assumptions hold exactly because of the symmetry of the gradient coil. In practice, these assumptions can be validated by manufacturing a single featureless, possibly thick and bulky plate, which is verified to be flat. A validation measurement can be made by attaching MRI visible material such as gel pads to the surface of the plates 212 and scanning the plates one by one in the MRI system's z=0 plane.

Keeping in mind these assumptions, the proposed calibration procedure is the following:

1. Move a first plate (or part) 212 of the phantom to the z=0 plane 110.
2. Take a 3D scan of the plate (or part) with submillimeter slices and a high signal bandwidth in a read-out direction. Because of the assumption about z-gradient coil symmetry, any z-distortion detected in the images must be mechanical inaccuracy of the phantom.
3. One by one, move subsequent plates (or parts) of the phantom to the z=0 plane and repeat previous steps. This movement can be automatically accomplished by moving the scanner table 208.
4. When a central plate 216 of the phantom is in the z=0 plane, take also a 3D coronal and sagittal scan with thin slices around the x=0 and y=0 planes 112, 114. Because of the assumptions about x and y gradient coil symmetry, any x and y distortion detected in these images must be because of the x and y offsets between the marker plates discussed previously.
5. One by one, move the rest of the plates to the z=0 plane and repeat step 2.

By means of this method, an actual geometry of the phantom can be determined. If this actual geometry is known, the phantom can be used to determine a geometric accuracy of subsequent MRI images.

Ideally, these assumptions hold because of the symmetry of the gradient coil. In practice, these assumptions can be validated by manufacturing a single featureless, possibly thick and bulky plate, which is verified to be flat. The validation measurement can be made by attaching MR visible material such as gel pads to the surface of the flat plate and scanning the plates one by one in each of the scanner central planes.

Figure 3:
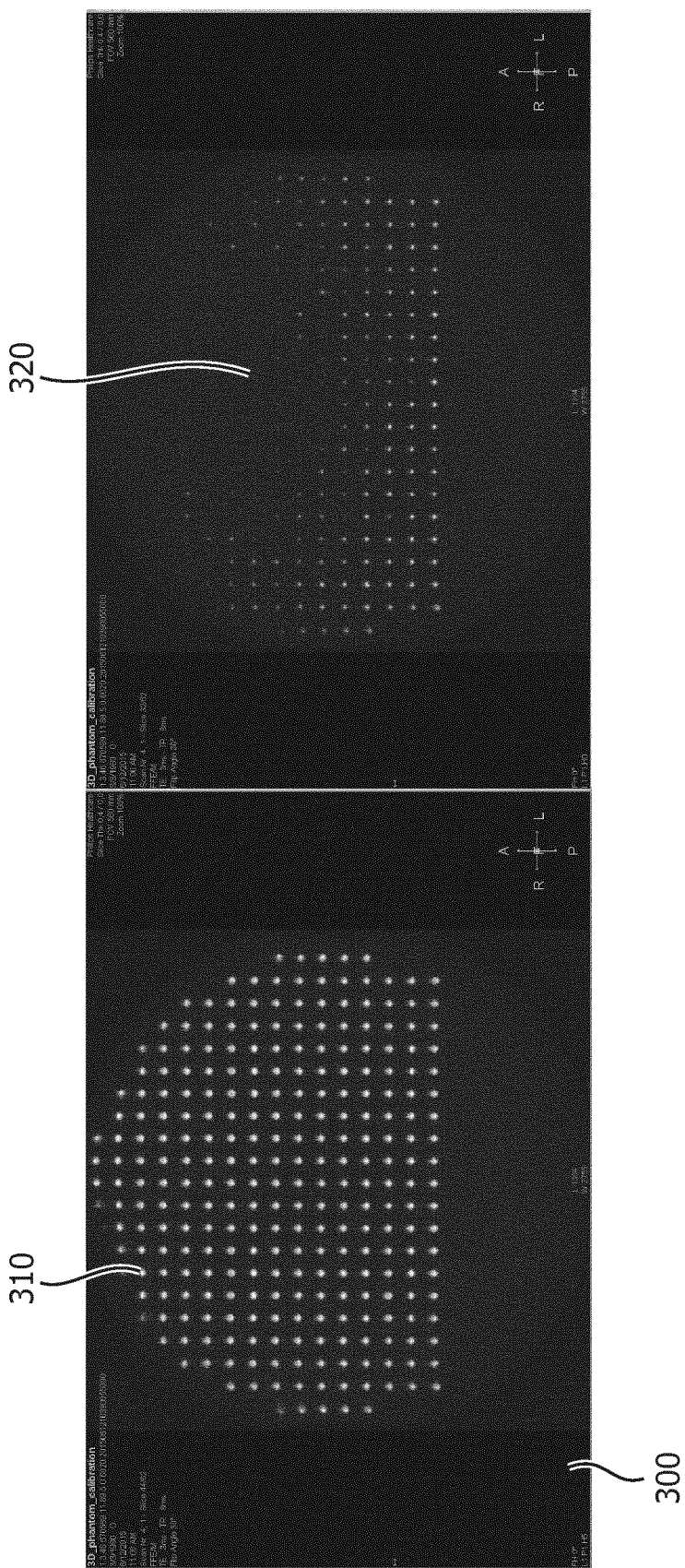
FIG. 3 shows a slices of an MRI image of a phantom according to the invention.

FIG. 3 shows slices 300 of an MRI image of a phantom according to the invention. In the slice representations 310 of the MRI detectable markers 214 can be seen. By means of the black area 320 in the right hand image can be seen that the plate deviates from the symmetry plane 110. The amount of deviation and so the geometric inaccuracy can be determined by analyzing a 3D volume of the MRI image.

Whilst the invention has been illustrated and described in detail in the drawings and foregoing description, such illustrations and description are to be considered illustrative or exemplary and not restrictive; the invention is not limited to the disclosed embodiments.

The invention claimed is:

1. A method for calibrating a magnetic resonance imaging (MRI) phantom having an expected geometry and comprising at least one MRI detectable part with a position within the geometry which is known with a geometric inaccuracy, wherein the method comprises steps of: placing the phantom at a predetermined location in a magnetic resonance system such that the MRI detectable part is within a symmetry plane of a gradient system of the magnetic resonance imaging system and; acquiring an MRI image of the MRI detectable part of the phantom by means of a first sequence, wherein the MRI image comprises multiple slices; determining the geometric inaccuracy of the MRI detectable part of the MRI phantom based on the position and the representation of the part in the MRI image.

2. The method for calibrating a magnetic resonance imaging (MRI) phantom as claimed in claim 1, wherein the MRI image is acquired using receive bandwidth >250 Hz/mm in a read-out direction.

3. A method for calibrating a magnetic resonance imaging (MRI) phantom as claimed in claim 1, wherein the method is applied to multiple parts of the MRI phantom.

4. A method for calibrating a magnetic resonance imaging (MRI) phantom as claimed in claim 3, wherein the phantom is moved between determining the geometric inaccuracy of a first part and determining the geometric inaccuracy of a second part.

5. A method for calibrating a magnetic resonance imaging (MRI) phantom as claimed in claim 4, wherein, the MRI phantom is placed on a scanner table of the MRI system and the movement is performed by means of moving the scanner table.

6. A method for calibrating a magnetic resonance imaging (MRI) phantom as claimed in claim 3, wherein a first part of the MRI phantom is within a first symmetry plane of the gradient system and the MRI image is acquired along the first symmetry plane and a second part of the MRI phantom is placed within a second symmetry plane of the gradient system and the MRI image is acquired along the second symmetry plane.

7. A method for calibrating a magnetic resonance imaging (MRI) phantom as claimed in claim 1, comprising a step of using the part of the MRI phantom in combination with the determined geometric inaccuracy to determine a geometric accuracy of a subsequent imaging sequence.

8. A computer program product for use for determining a geometric accuracy of an magnetic resonance imaging phantom, the computer program product comprising program code:
for causing a magnetic resonance imaging system to acquire an MRI image of an MRI detectable part of the phantom by means of a first sequence, wherein the MRI image comprises multiple slices and;
for causing a computer to determine the geometric inaccuracy of the MRI detectable part of the MRI phantom based on the position and the representation of the part in the MRI image under the assumption that the phantom was placed within a symmetry plane of a gradient system of the magnetic resonance imaging system.

9. A computer program product further comprising program code means for causing a magnetic resonance imaging system comprising a computer to execute the program code and a method according to claim 1 to acquire the MRI image using receive bandwidth >250 Hz/mm in a read-out direction.

10. A method as claimed in claim 1, where at least one detectable part has the shape of a flat or curved plate or a plurality of such plates, preferably connected to each other by means of a connection member 240 such that they are connected but spaced apart.

11. A method as claimed in claim 1, where the following steps are executed:
i) Moving a first part 212 of the phantom comprising multiple parts to the z=0 plane 110;
ii) Taking a 3D scan of this part with submillimeter slices and a high signal bandwidth in a read-out direction;
iii) Moving subsequent parts of the phantom to the z=0 plane;
iv) Repeating previous steps for all parts of the phantom.

12. A method for calibrating a magnetic resonance imaging (MRI) phantom comprising at least one MRI detectable part with a position within the phantom, that deviates from an expected (i.e. target) position by an unknown geometric inaccuracy caused by manufacturing imprecision, wherein the method comprises:
placing the phantom at a predetermined location in a magnetic resonance system such that the MRI detectable part is at least partially within a symmetry plane, i.e. along one of the x=0, y=0 or z=0 planes of a gradient system of the magnetic resonance imaging system and;
acquiring an MRI image of the MRI detectable part of the phantom by means of a first sequence, wherein the MRI image comprises multiple slices;
determining the geometric inaccuracy based on a deviation of the actual position of the MRI detectable part from the expected geometry of the MRI detectable part of the MRI phantom based on the position and the representation of the part in the MRI image.

* * * * *